United States Patent [19]

Erkan et al.

[11] 4,420,869
[45] Dec. 20, 1983

[54] METHOD OF MANUFACTURING A THYRISTER HOUSING

[75] Inventors: Gunduz Erkan, Middletown; George Scott, Warwick, both of N.Y.

[73] Assignee: Interceram, Inc., Middletown, N.Y.

[21] Appl. No.: 477,139

[22] Filed: Mar. 21, 1983

[51] Int. Cl.³ .......................................... H01L 21/48
[52] U.S. Cl. ...................................... 29/460; 29/589; 228/124; 445/44
[58] Field of Search ................ 29/460, 589; 228/122, 228/124, 123; 445/43, 44; 174/152 GM

[56] References Cited

U.S. PATENT DOCUMENTS

| | | |
|---|---|---|
| 2,087,384 | 7/1937 | Lee . |
| 2,628,264 | 2/1953 | Esher . |
| 2,859,390 | 11/1958 | Baker . |
| 2,873,510 | 2/1959 | Duran et al. ........................ 228/124 |
| 3,006,983 | 10/1961 | McDurmont . |
| 3,044,037 | 7/1962 | Honig . |
| 3,241,095 | 3/1966 | Phillips . |
| 3,751,800 | 8/1973 | Daniels et al. ................... 228/122 X |
| 3,877,769 | 4/1975 | Berg et al. ........................ 339/17 R |
| 4,141,615 | 2/1979 | Takeuchi et al. . |

*Primary Examiner*—Kenneth J. Ramsey
*Attorney, Agent, or Firm*—Jack D. Slobod

[57] ABSTRACT

A thyristor housing and method of its manufacture in which a gate tube passing through a radially directed bore in a tubular insulator is hermetically sealed by metal closures at each end to prevent accumulation of contaminants inside the gate tube during final plating the metal parts secured to said housing. The metal closure on the inwardly directed end of the gate tube is frangible for receiving a lead from the thyristor to be packaged in the housing.

9 Claims, 5 Drawing Figures

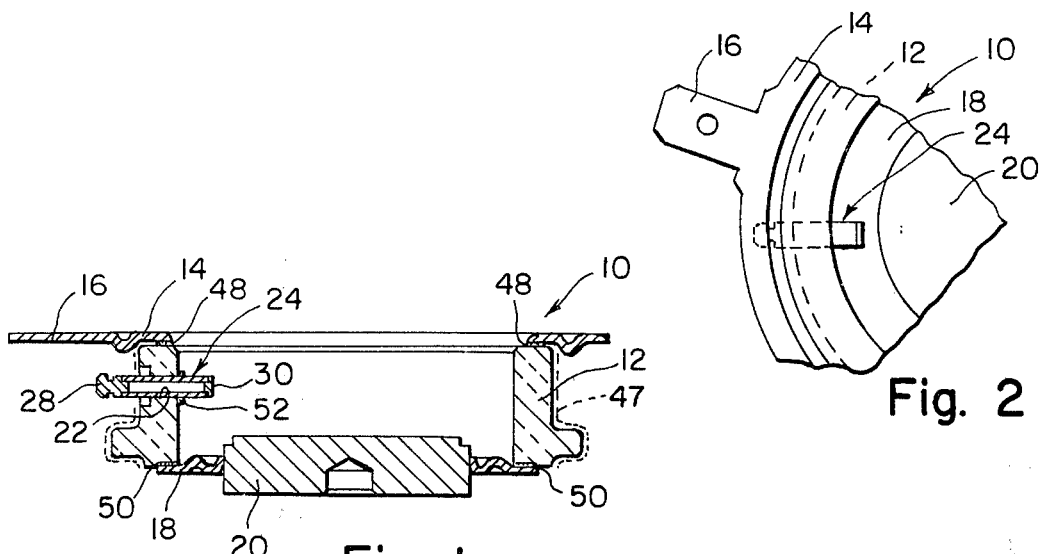
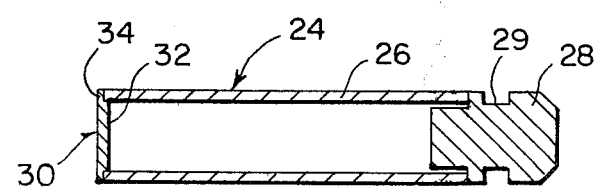
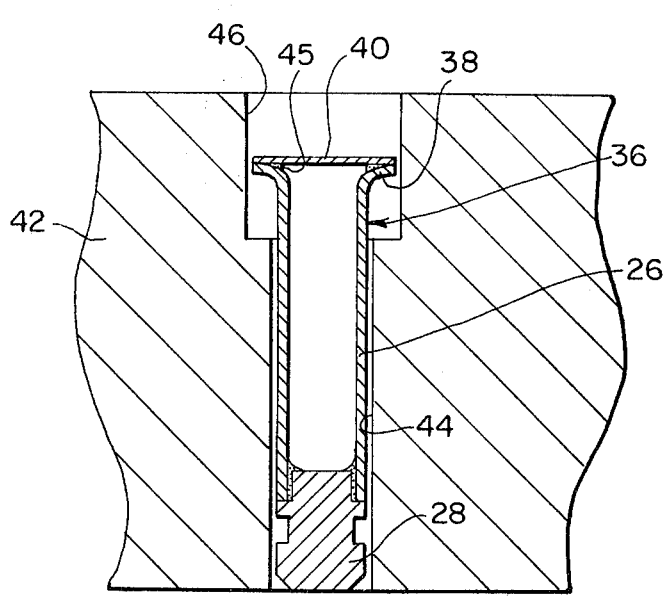
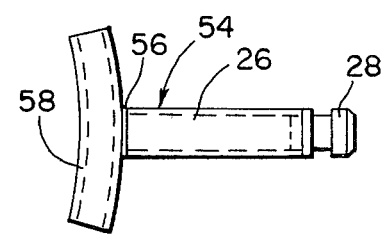

METHOD OF MANUFACTURING A THYRISTER HOUSING

FIELD OF THE INVENTION

The present invention relates generally to insulated housings of a type for receiving a thyristor semiconductor element and the method of manufacture of the housing. In its particular aspects, the present invention relates to a thyristor housing in which the gate tube is hermetically sealed.

BACKGROUND OF THE INVENTION

Heretofore, thyristors or silicon controlled rectifiers, have been packaged hermetically in a so-called "hockey puck" or "press pack" configuration housing including a generally tubular ceramic housing having circular metal contacts on each end respectively coupled to the anode and cathode electrodes of the thyristor. A tube, known as the "gate tube" which is located in a radially directed bore in the wall of the ceramic receives within the radially inwardly directed end of the tube, a lead from the gate electrode of the thyristor which is brazed, soldered, welded or mechanically secured in place. The radially outwardly directed end of the gate tube carries a plug forming a connector means.

In the manufacture of the thyristor housing, cleaning solution or plating electrolytes have collected within the gate tube leading in time to corrosion of the gate tube and the mechanical failure of the same. Washing the offending contaminants from the gate tube is not easily accomplished because the plug is secured on the gate tube prior to the plating and or cleaning steps making the gate tube in effect a small diameter blind bore.

While temporary caps or plugs, punchouts, and integral closures have heretofore been used in conjunction with electrical connectors generally, we are unaware of any manufacturing process for an electrical product in which a part is temporarily hermetically sealed to avoid contamination in subsequent stages in the manufacturing process.

OBJECTS AND SUMMARY OF THE INVENTION

It is an object of the present invention to provide a method for manufacture of a thyristor housing in which the interior of the gate tube is hermetically sealed prior to plating and/or cleaning steps to avoid the collection of any contaminant.

It is a further object of the present invention to provide a thyristor housing including a gate tube which is hermetically sealed on its inner end by a frangible membrane or plug.

Briefly, the aforementioned and other objects of the present invention are accomplished by preferably simultaneously securing in place the connector plug on one end of the gate tube and a frangible disc or plug on the other end of the gate tube to hermetically seal the gate tube prior to the assembly of the gate tube into the ceramic portion of the thyristor housing.

The foregoing and other objects, features and operative steps of the present invention will become apparent upon perusal of the detailed description of the present invention in conjunction with the appended drawing.

DESCRIPTION OF THE DRAWING

FIG. 1 is a cross-sectional elevational view of the thyristor housing of the present invention showing one embodiment of the gate tube assembly;

FIG. 2 is a top view of a portion of the thyristor housing in FIG. 1;

FIG. 3 is a longitudinal cross-sectional view of the gate tube assembly in FIG. 1;

FIG. 4 is a longitudinal cross-sectional view of another embodiment of the gate tube assembly in conjunction with a fixture for hermetically sealing the same; and FIG. 5 is a longitudinal view of still anothe embodiment of the gate tube assembly.

DETAILED DESCRIPTION OF THE INVENTION

Referring to FIGS. 1 and 2 of the drawing, the "hockey puck" or "press-pack" configuration thyristor housing 10, of the present invention comprises a generally tubular ceramic insulator 12 having a copper annular member or flange 14 secured at one end, including the connector tab 16, and a circular contact member 18 at the other end including the central thickened heat sink portion 20. Secured within a radially directed bore 22 in the insulator 12 is the gate tube assembly 24. With additional reference to FIG. 3, the gate tube assembly 24 includes an elongated metal tube 26, of a material such as kovor having a compatible coefficient of thermal expansion to the ceramic 12, in one end of which is brazed a metal plug 28 as of nickel plated steel. The plug 28 includes the groove 29, for receiving a standard electrical connector socket. The other end of tube 26 has brazed therein a frangible metal plug 30 as of nickel preferably under 0.010 inch (0.25 mm) in thickness. The tube 26 has an outside diameter of about 0.058 inch (1.45 mm) and an inside diameter of about 0.040 inch (1 mm). The plug 30 includes a small diameter portion 32 that fits within the inside diameter of tube 26 and a radial flange 34 that rests against the end of tube 26.

In FIG. 4 there is illustrated another embodiment 36 of the tube assembly in which the tube 26 has a flared end 38 and the plug 32 is replaced by a frangible metal disc 40, preferably of nickel and 0.002 inch (0.05 mm) thickness, which is brazed in place against the flared end 38.

The gate tube assembly 36 is preferably manufactured utilizing the fixture 42, constructed of carbon or other suitable material, which includes the bore 44 and counterbore 46 respectively sized for a sliding fit with the outside diameter of tube 26 and flared end 38. The plug is first placed at the bottom of bore 44 and the tube 26 is then seated about plug 28. Thereafter, a pellet of braze (not shown) is dropped into the upright tube 26 and an annular ring of braze 45, having the same outside diameter as disc 40 and a greater inside diameter than the inside diameter of tube 26 is placed on top of the flare and the disc 40 is placed on top of the braze ring. The braze ring 45 and disc 40 are located precisely by counterbore 46. Convenient brazes to construct the gate tube assembly are copper and silver. Then by placing the fixture 42 with parts assembled therein within a furnace having a reducing or non-oxidizing atmosphere, the pellet of braze is flowed to sealably secure plug 28 to tube 26 and the ring of braze 45 is flowed to sealably secure the disc 40 to the flared end 38 thereby hermetically sealing the interior of tube 26. This hermetic seal should provide less than $1 \times 10^{-8}$ standard cubic centimeters per second leak rate as measured on a Helium Mass Spectrometer under 1 atmosphere pressure differential. The embodiment 24 of the gate tube assembly is assembled and brazed in a similar fashion to hermetically seal the interior of tube 26.

In the manufacture of the thyristor housing shown in FIGS. 1 and 2, annular rings of metallization (not shown) are painted on the opposite flat ends of ceramic insulator 12 and metalization is also applied along the bore 22. Also, a glaze 47 is painted on the cylinder periphery of insulator 12. The metalization coatings and glaze are either sequentially or simultaneously fired in a furnace.

Thereafter, within a suitable fixture (not shown), the insulator 12 is sandwiched between the members 16 and 18, with the members respectively against braze rings, or preforms 48 and 50, sized to bear against the respective annular metalization coatings. The gate tube assembly 24 or 36 is inserted slidably within bore 22 with the plug 28 projecting radially outward and ring of braze preform 52 is slided over the outside diameter of tube 26 and against the sidewall of ceramic insulator 12, either from the inside of the insulator or, as shown, from the outside. The braze used for preforms or rings 48, 50 and 52 is selected to be of a lower temperature type that used to hermetically seal the gate tube assembly 24 or 26. This assembly is placed in a furnace at a suitable temperature to flow the braze rings 48 and 50 to sealably adhere the members 14 and 16 to the annular metalization coatings on the ceramic insulator 12. The braze ring 52 is also flowed into bore 22 to sealably adhere the gate tube assembly 24 or 36 to the metalization coating lining the bore 22.

Subsequently the thyristor housing assembly 10 is cleaned by immersion in cleaning solutions such as solvents and/or other solutions such as degreasers, drying agents such as alcohol or freon, and/or acid such as Hydrochloric. After cleaning, the housing assembly is placed in an electroplating or immersion plating tank to plate the exposed surfaces of the metal parts with a suitable deposition such as nickel. Cleaning by immersion in similar cleaning solutions may also occur after plating. The gate tube assembly being hermetically sealed, does not accumulate any solvent, solution or electrolyte.

In the applicable industry the thyristor housing, including loose lid (not shown) shaped similarly to contact member 18, is sold to others who package a thyristor therein. This is done by mounting a thyristor semiconductor element (not shown) within the housing 10 and upon the heat sink portion 20. The disc 40 or plug 30 of the gate tube assembly is then punctured with a pointed instrument and a lead from the gate electrode of the thyristor is inserted into the gate tube and mechanically secured in place. The lid is thereafter cold welded on top of flange 14 to hermetically seal the thyristor housing 10.

In the embodiment 54 of the gate tube assembly shown in FIG. 5, in place of the plug 30 or disc 40, there is brazed on the end of tube 26, a disc 56 of the same diameter as the outside diameter of tube 26 to hermetically seal the tube. This disc need not be frangible since an arcuate tube 58 is brazed against the disc 56. The tube 58 can receive leads from each open end. It should be emphasized that although the tube 26 need not receive lead, it must be tubular and not a solid rod in order to accommodate the thermal expansion and contraction of the ceramic insulator 12. The gate tube assembly 54 is assembled in the thyristor housing 10 in a similar manner to that shown in FIG. 1, except with braze ring 52 against the outer sidewall of ceramic 12.

While preferred embodiments of the present invention have been described in particular detail, it should be apparent that numerous modifications, additions and omissions of these detailed features and steps are possible within the intended spirit and scope of the invention.

What is claimed is:

1. The method of manufacture of a thyristor housing comprising the steps of:
    a. Applying metalization coating along each generally circular edge of a generally tubular insulator and along a radially directed bore through a wall of said insulator;
    b. Forming a gate tube assembly by securing metal closures sealably on opposite ends of a gate tube, in a manner that the interior of said gate tube is hermetically sealed;
    c. Assembling said thyristor housing by brazing generally circular metal members, each having a generally circular periphery, on opposite ends of said insulator and respectively along the metalization coatings on opposite ends thereof and brazing said gate tube assembly in said bore with one end of said gate tube projecting radially outward from said insulator; and
    d. Thereafter, plating the exposed metal surfaces of said housing.

2. The method of claim 1 wherein one of said closures is frangible and further comprising the final step of puncturing said frangible closure.

3. The method of claim 2 wherein said brazing steps are performed simultaneously.

4. The method of Claim 1 wherein said brazing steps are performed simultaneously.

5. The method of manufacture of a thyristor housing comprising the steps of:
    a. Applying metalization coating along each generally circular edge of a generally tubular insulator and along a radially directed bore through a wall of said insulator;
    b. Forming a gate tube assembly by securing metal closures sealably on opposite ends of a gate tube, in a manner that the interior of said gate tube is hermetically sealed;
    c. Assembling said thyristor housing by brazing generally circular metal members, each having a generally circular periphery, on opposite ends of said insulator and respectively along the metalization coatings on opposite ends thereof and brazing said gate tube assembly in said bore with one end of said gate tube projecting radially outward from said insulator; and
    d. Thereafter, immersing the said housing in a cleaning solution.

6. The method of claim 5 wherein one of said closures is frangible and further comprising the final step of puncturing said frangible closure.

7. The method of claim 6 wherein said brazing steps are performed simultaneously.

8. The method of claim 5 wherein said brazing steps are performed simultaneously.

9. The method of claim 5 further comprising the final step of plating the exposed metal surfaces of said housing.

* * * * *